(12) United States Patent
Minato

(10) Patent No.: US 6,225,649 B1
(45) Date of Patent: May 1, 2001

(54) INSULATED-GATE BIPOLAR SEMICONDUCTOR DEVICE

(75) Inventor: Tadaharu Minato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/462,947

(22) PCT Filed: Jan. 22, 1998

(86) PCT No.: PCT/JP98/00247

§ 371 Date: Jan. 18, 2000

§ 102(e) Date: Jan. 18, 2000

(87) PCT Pub. No.: WO99/38214

PCT Pub. Date: Jul. 29, 1999

(51) Int. Cl.[7] .......................... H01L 29/74; H01L 31/111
(52) U.S. Cl. ............................................. 257/133; 257/154
(58) Field of Search .................................... 257/133, 154

(56) References Cited

U.S. PATENT DOCUMENTS

| | | |
|---|---|---|
| 4,827,321 * | 5/1989 | Baliga . |
| 4,994,871 | 2/1991 | Chang et al. . |
| 5,082,795 * | 1/1992 | Temple . |
| 5,298,780 | 3/1994 | Harada . |
| 5,554,862 * | 9/1996 | Omura et al. . |
| 5,559,656 | 9/1996 | Chokhawala . |

FOREIGN PATENT DOCUMENTS

| | | |
|---|---|---|
| 4-011780 | 1/1992 | (JP) . |
| 5-226661 | 9/1993 | (JP) . |
| 6-13621 | 1/1994 | (JP) . |
| 7-235672 | 9/1995 | (JP) . |
| 8-70121 | 3/1996 | (JP) . |
| 9-283755 | 10/1997 | (JP) . |

OTHER PUBLICATIONS

"600V Trench IGBT in Comparison with Planar IGBT: An Evaluation of the Limit of IGBT Performance", by M. Harada et al., Proc. of the 6th International Symposium on Power Semiconductor Devices & IC's, May 31–Jun. 2, 1994, Session 9, Paper 9.3, pp. 411–416.

* cited by examiner

Primary Examiner—Stephen D. Meier
(74) Attorney, Agent, or Firm—McDermott, Will & Emery

(57) ABSTRACT

An insulated-gate bipolar semiconductor device is provided wherein electric resistance generated in an emitter impurity region and between an emitter electrode and a region in the close vicinity of a gate takes a prescribe value irrespective of the distance of the emitter impurity region in direct contact with the emitter electrode in order to increase a load short circuit safe operation region without degrading the forward voltage drop and switching characteristic.

26 Claims, 22 Drawing Sheets

INSULATED-GATE BIPOLAR SEMICONDUCTOR DEVICE

TECHNICAL FIELD

The present invention relates to power insulated-gate bipolar semiconductor devices (hereinafter as "IGBTs").

BACKGROUND ART

Typically in the power semiconductor device, power loss during conduction or transition loss generated in switching must be reduced. A power semiconductor device in an electrical circuit must be protected safely against inadvertent phenomenon (accidents) such as load short circuit, and therefore a wide safe operation area is another important characteristic required for the power semiconductor device.

The load short circuit refers to a short circuit in a load such as motor from some cause. If a short circuit is caused, there will be almost no load to limit current passed across the power semiconductor device, and power supply voltage is directly applied to the power semiconductor device, the current passed across which could take a huge value up to the limit value of the conduction capability of the power semiconductor device (from several hundred to several thousand $A/cm^2$). Therefore, power at the time of a load short circuit could cause a very hazardous condition which leads to damages to the entire system or explosion.

In order to solve the problem of the load short circuit, it is critical to obtain a power semiconductor device strong against a load short circuit, in other words, a power semiconductor device having a wider Short-Circuit Safe Operation Area (herein after simply as "SCSOA").

To increase the SCSOA is the trade off for improvement in the on-voltage (forward voltage drop) or the switching characteristic among other characteristics of the power semiconductor device, and therefore it is also important to increase the SCSOA without degrading these other characteristics.

As disclosed by Japanese Patent Laying-Open No. 7-235672, it is known that in a trench MOS gate IGBT, the trade off between the on-voltage and turn off loss or the trade off between the maximum control current and the SCSOA is effectively improved by forming the two dimensional pattern of an n-type emitter into a ladder shape. It is also reported that the size or shape of the ladder pattern of the n-type emitter can be devised to improve the short circuit withstanding level of the IGBT. The short circuit withstanding level herein refers to the length of time since the occurrence of a load short circuit during conduction unitl thermal destruction of the power semiconductor device by heat generated inside ("time endurance under short circuit condition," hereinafter simply as "tsc"). With a high short circuit withstanding level, in other words, with a long tsc, the power semiconductor device could be sustained for a longer period of time before a gate control signal is turned off by an external protection circuit connected to the device if a load short circuit occurs, so that the circuit can be turned off safely with a gate cut off signal.

The method with the ladder shaped, n-type emitter pattern disclosed by the above-described document, however, cannot increase the short circuit withstanding level to a sufficient level.

DISCLOSURE OF THE INVENTION

In an insulated-gate type bipolar semiconductor device according to the present invention, electric resistance embedded in the emitter electrode and the impurity region of the emitter very close to the control conductor has a prescribed value independently the distance of the emitter impurity region in direct contact with the emitter electrode.

Also in an insulated-gate bipolar semiconductor device according to the present invention, there is provided a region to increase the specific resistance of a part of the emitter impurity region having low internal resistance.

BEST MODE FOR CARRYING OUT THE INVENTION

The present invention will be now described in detail in conjunction with the accompanying drawings by referring to several embodiments and modifications thereof.

First Embodiment

Figure 1:
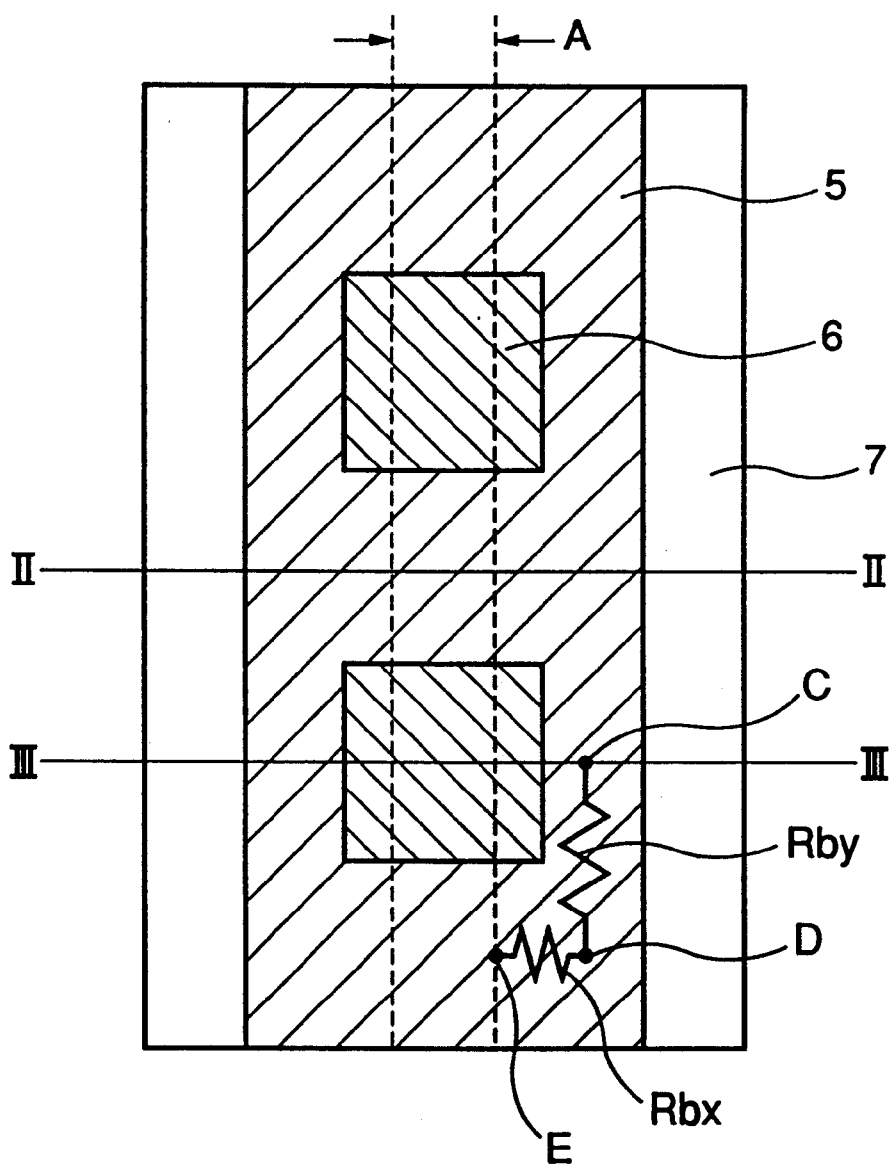
FIG. 1 is a plan view of a first embodiment of the present invention.
Figure 2:
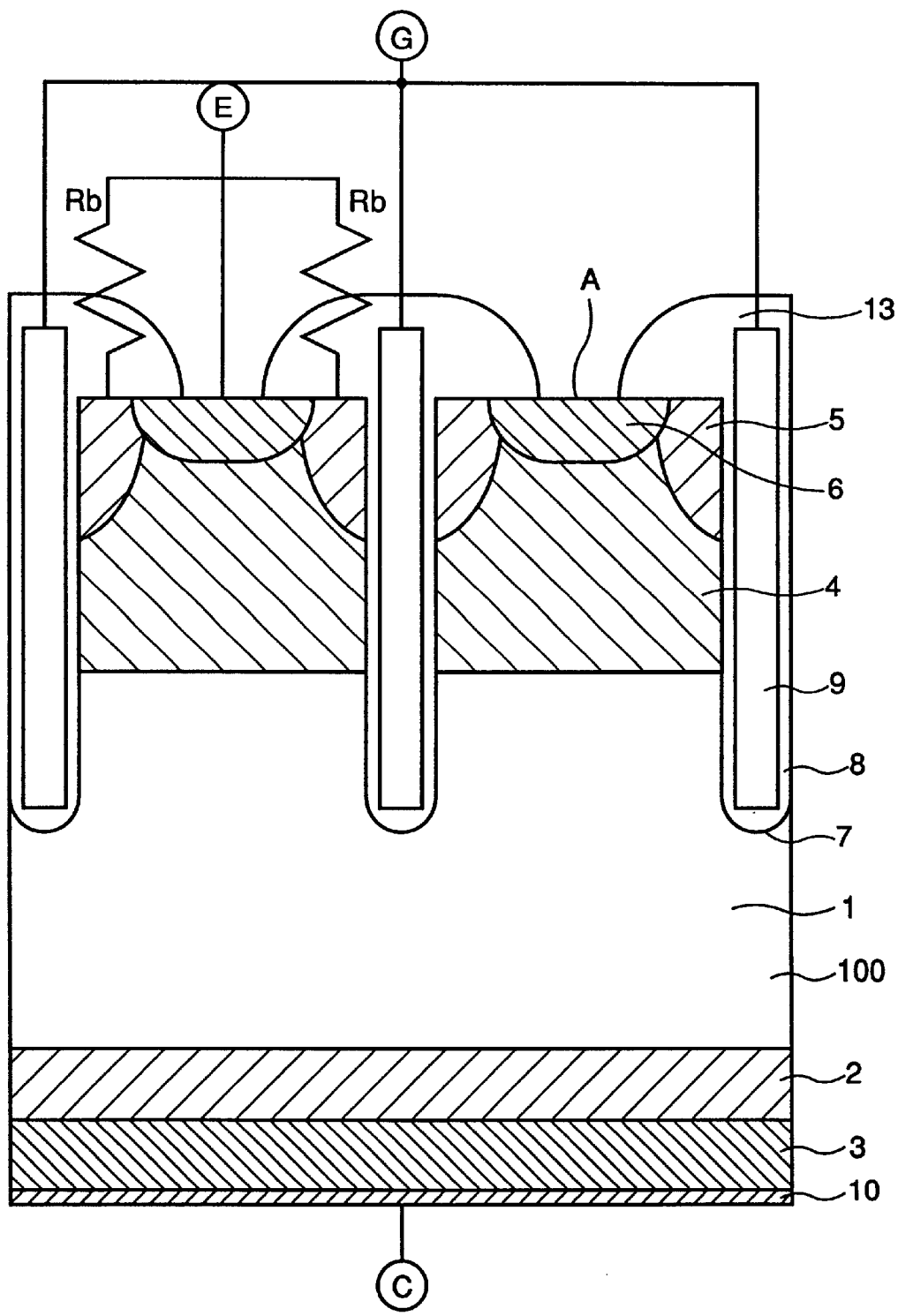
FIG. 2 is a conceptional view taken along line III—III in FIG. 1 showing the connection to a part of a cross section taken along line II—II in FIG. 1.
Figure 3:
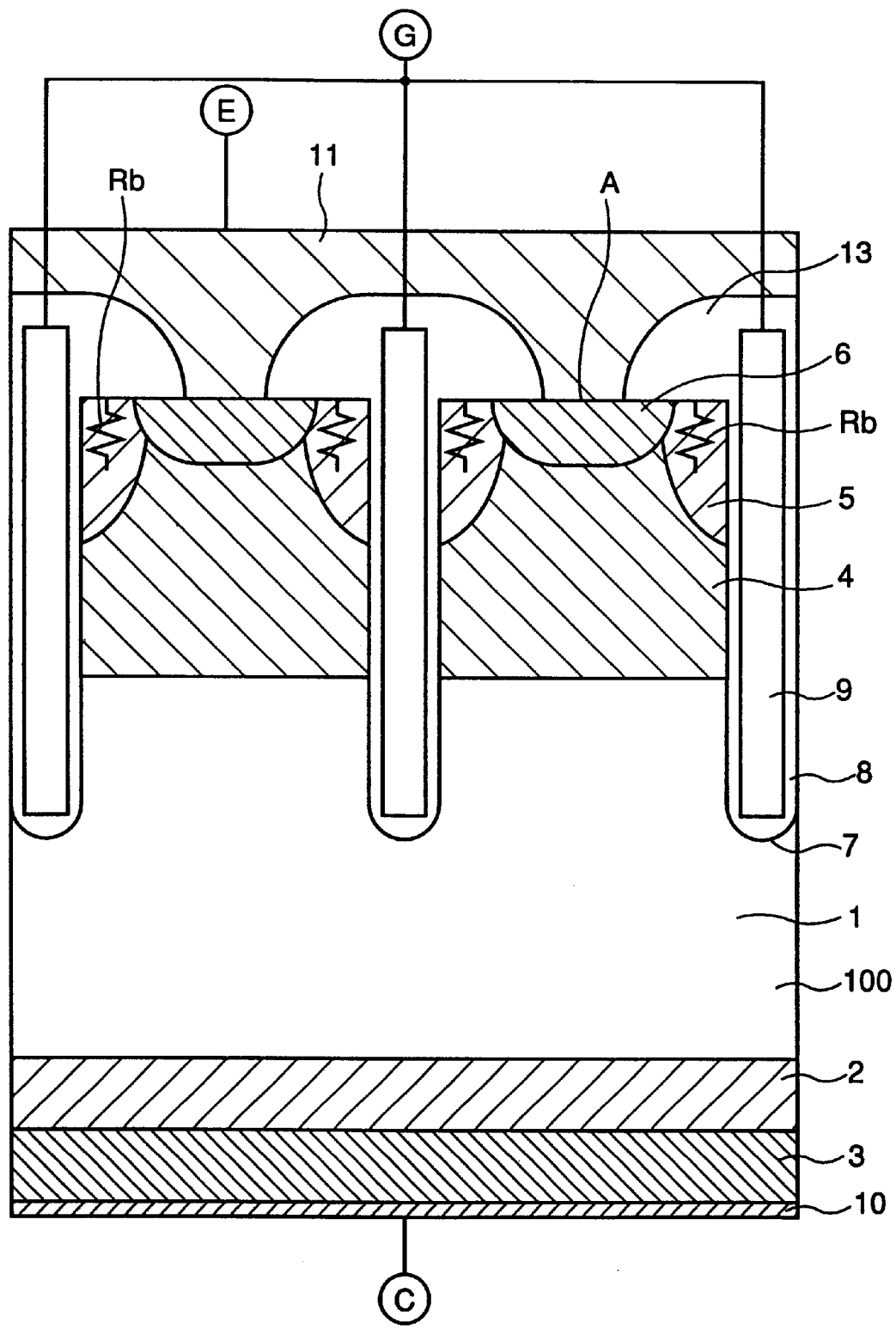
FIG. 3 is a cross sectional view taken along line III—III in FIG. 1.

FIG. 1 is a plan view of a first embodiment of the present invention, FIG. 2 is a conceptional view of a cross section taken along line III—III in FIG. 1 showing the connection to a part of a cross section taken along line II—II and FIG. 3 is also a cross sectional view taken along line III—III in FIG. 1. In these figures, reference numeral 1 represents an n$^+$type semiconductor layer, 2 an n$^+$type buffer layer, 3 a p$^+$type collector region, 4 a p-type base region, 5 a ladder shaped n+type emitter region, and 6 a p$^+$type contact region. These semiconductor layers and semiconductor regions form a semiconductor substrate 100.

A trench 7 is formed from the upper surface side of semiconductor substrate 100 to reach a part of n$^-$type semiconductor layer 1, and trench 7 is provided with a gate insulating film 8 and a gate conductor 9. A collector electrode 10 is provided under semiconductor substrate 100, and an emitter electrode 11 is provided on the substrate. The upper part of semiconductor substrate 100 is covered with an insulating layer 13 except for a contact hole region A. The termination structure for sustaining the forward block breakdown voltage is, however, not described here.

FIG. 1 shows the top of n$^+$emitter region 5 formed to have a ladder shaped pattern. In FIG. 1, Rbx and Rby represent divided components of internal resistance generated in the ladder shaped pattern of the n$^+$emitter region. FIG. 2 schematically shows how the internal resistance functions like an electrical circuit. The macroscopic function of the n-emitter ballast resistance (Rb) is to restrain the Icp or Icsat of short circuit current. FIG. 3 schematically shows that the n-emitter ballast resistance (Rb) is taken inside.

In order to restrain the saturation value (Icsat) of short circuit current to a low level, emitter ballast resistance Rby across the C-D region is set to an extremely small value, while emitter ballast resistance Rbx across the D-E region is set to a sufficiently large value. More specifically, Rby<<Rbx is established.

The first approach to establish Rby<<Rbx is to set the distance LCD between C and D to be sufficiently smaller than the distance LDE between D and E, more specifically to establish LCD<<LDE, provided that the n-type impurity concentration of n$^+$type emitter region 5 is constant.

The second approach is to set impurity concentration CCD in the C-D region to be higher than impurity concentration CDE in the D-E region so that specific resistance pCD across the C-D region is sufficiently lower than specific resistance pDE across the D-E region. More specifically if CDE<<CCD is established, pCD<<pDE holds.

More specifically, it is known from simulation experiments that when a several KV-order, high breakdown voltage trench IGBT is used, the entire emitter ballast resistance Rb to be applied to the all the elements of several ten A to several hundred A has only to be in the range from 0.005 to 0.01 Ω. On-voltage rise (ΔVon) in this case is the product of the entire emitter ballast resistance Rb and a rated current value (Ic rat), and therefore, the on-voltage rise is represented by the following expression if Rb is 0.05 Ω and Icrat is 100 A.

$$\Delta Von = Rb \times Icrat = 0.005\ (\Omega) \times 100\ (A) = 0.5\ (V)$$

Figure 4A:
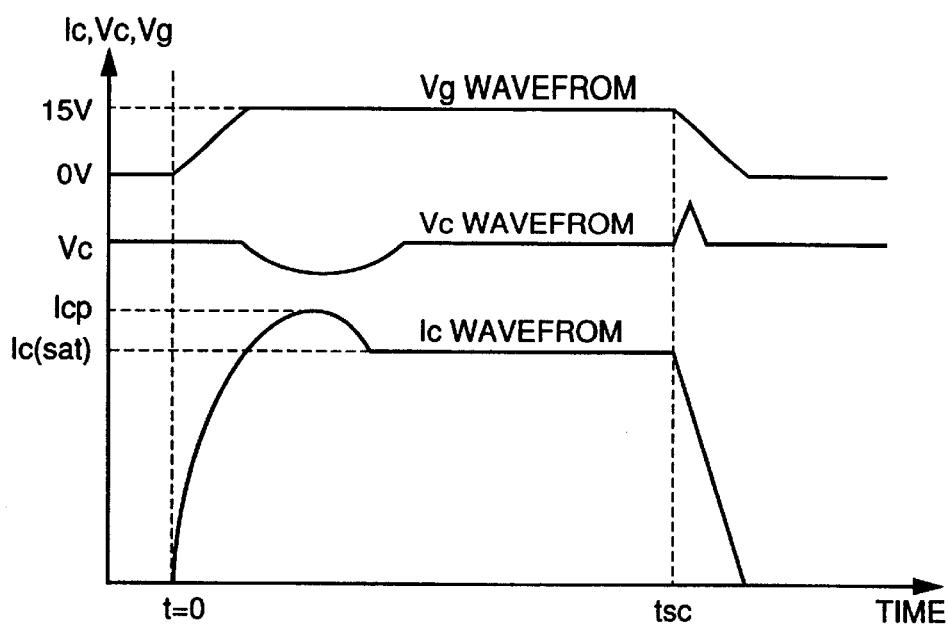
FIG. 4(a) is a waveform chart when a circuit test is performed.
Figure 4B:
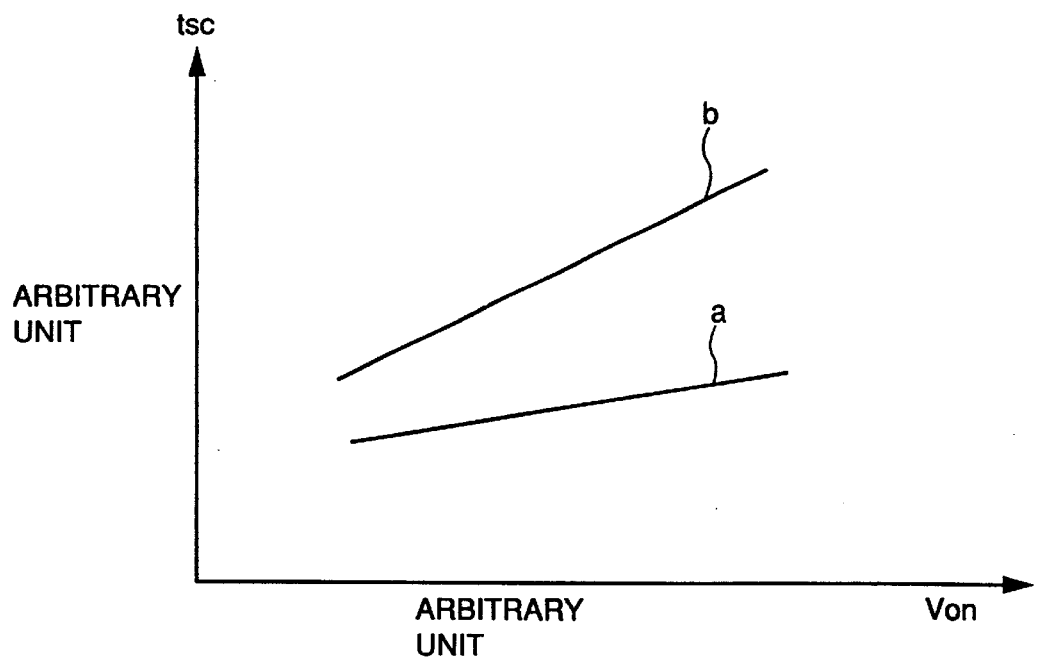
FIG. 4(b) is a graph showing a short circuit withstanding level.

FIG. 4(a) is a waveform chart of collector current (Ic), collector voltage (Vc) and gate input voltage (Vg) when a circuit test is performed for IGBT elements. FIG. 4(b) is a graph showing the SCSOA of the IGBT. In FIG. 4(b), a represents a conventional case and b the present invention.

As described above, on-voltage (Von) increases with the value of the emitter ballast resistance applied, while as shown in FIG. 4(b), on-voltage (Von) and the short circuit withstanding level are essentially in a trade off relation where tsc is shorter (worse) for lower on-voltage (better). However, the on-voltage (Von) of the IGBT elements can be set within the allowance of the electrical circuit system used. The on-voltage (Von) value required for a high breakdown voltage element is at some several V which is relatively high as compared to medium and low breakdown voltage elements, the allowance of the on-voltage rise is wide and therefore the method according to the present invention is effective. More specifically, according to conventional cases, as shown in FIG. 4(b) at a, if tsc corresponding to the short circuit withstanding level is set long, the on-voltage rise is very large, while according to the present invention, as shown in FIG. 4(b) at b, the on-voltage rise corresponding to improvement in tsc can be restrained at a low level.

Second Embodiment

Figure 5:
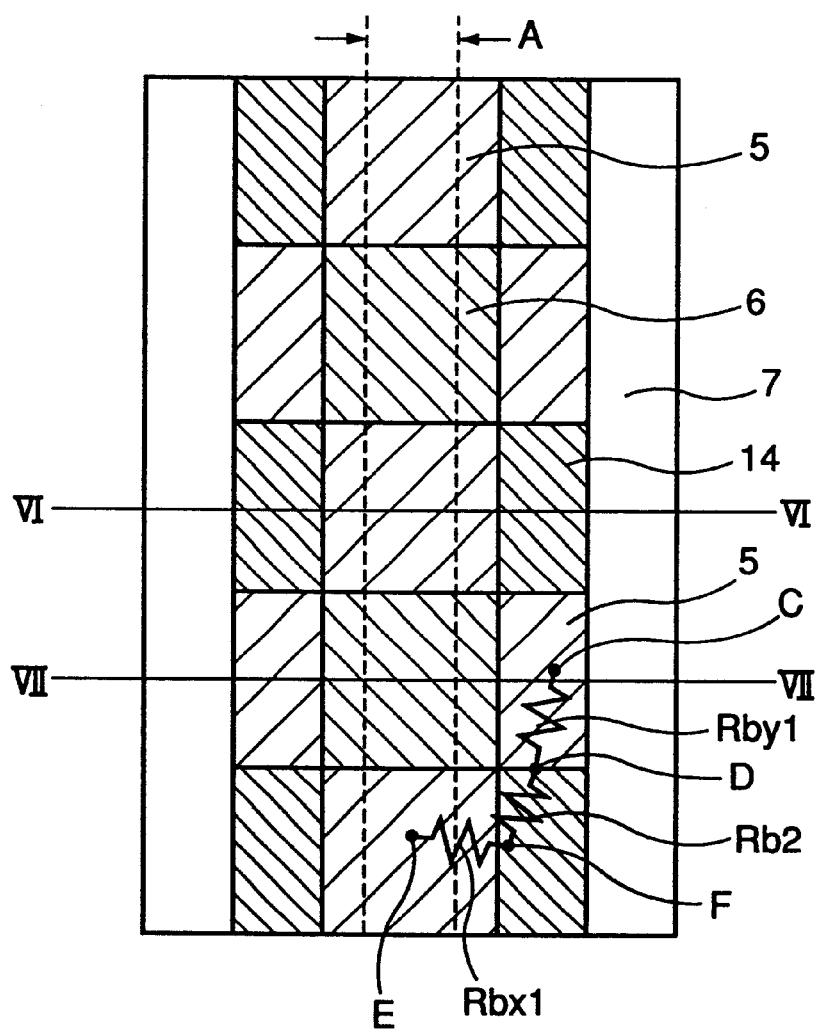
FIG. 5 is a plan view of a second embodiment of the present invention.
Figure 6:
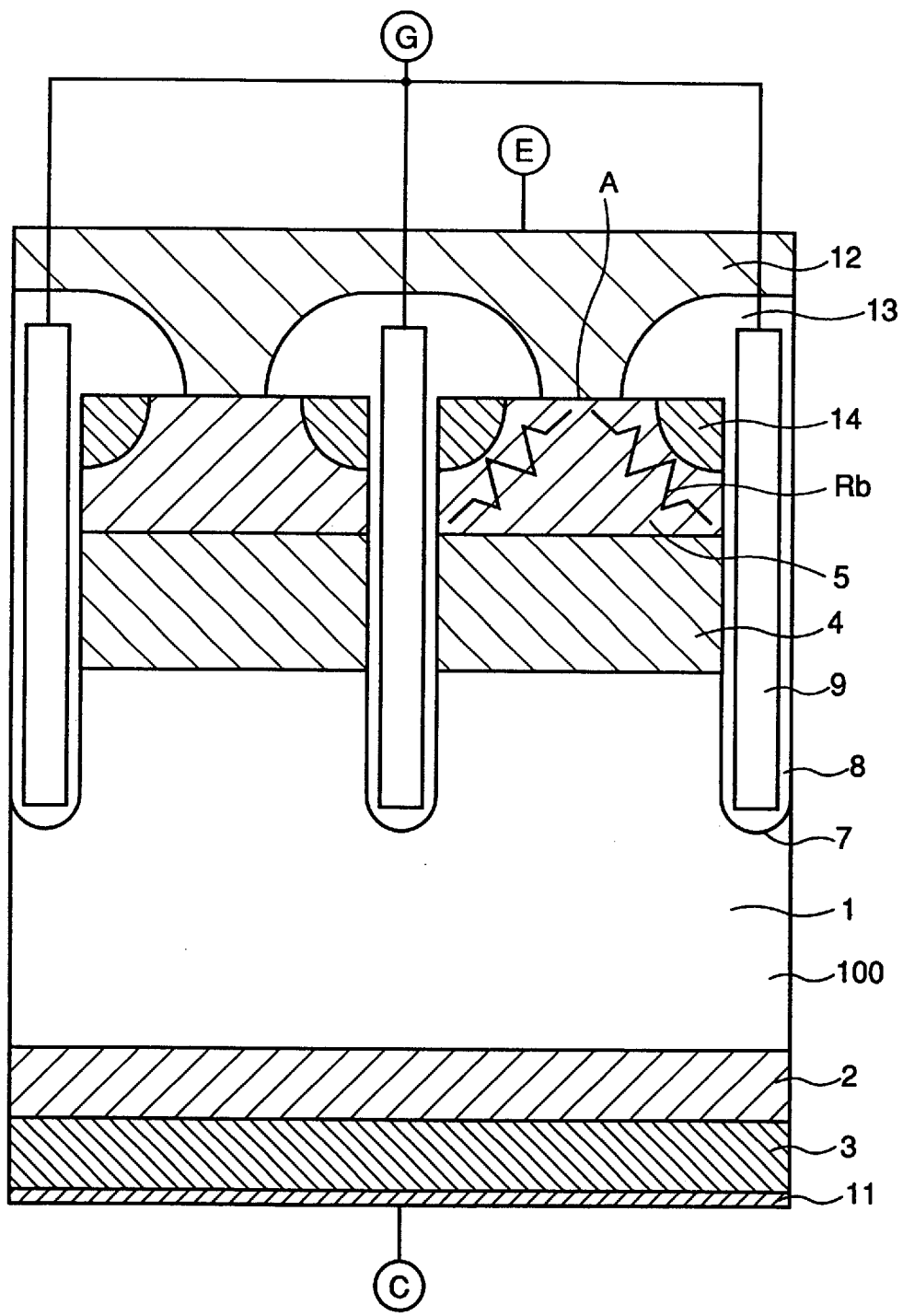
FIG. 6 is a cross sectional view taken along line VI—VI in FIG. 5.
Figure 7:
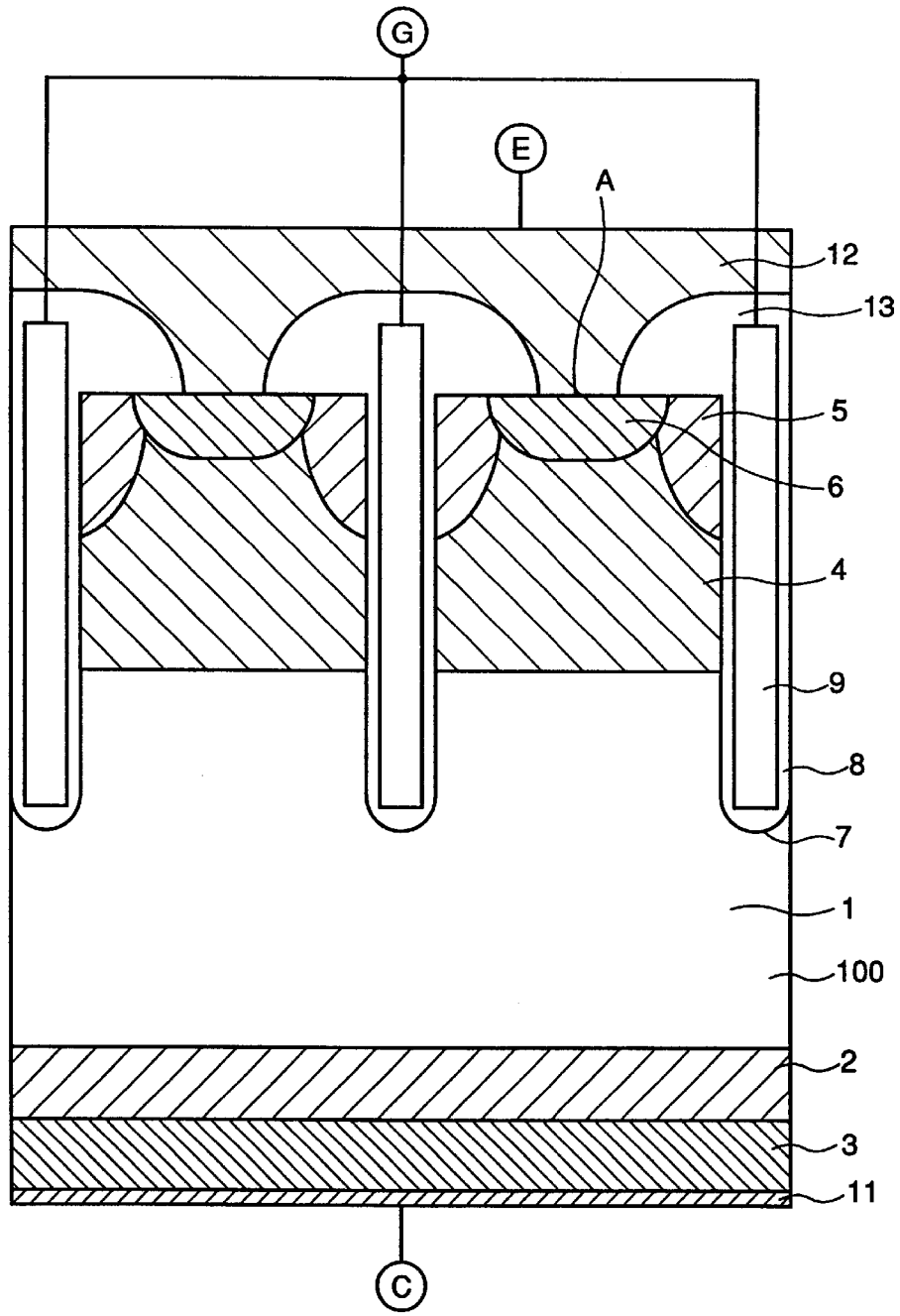
FIG. 7 is a cross sectional view taken along line VII—VII in FIG. 5.

FIG. 5 is a plan view of a second embodiment of the present invention, FIG. 6 is a cross sectional view taken along line VI—VI in FIG. 5, and FIG. 7 is a cross sectional view taken along line VII—VII in FIG. 5 The second embodiment is different from the first embodiment shown in FIGS. 1 to 3 in that a p$^+$diffusion region 14 is provided in n$^+$type emitter region 5 as shown in FIGS. 5 and 6. The other structure is the same as that of the first embodiment.

In the second embodiment, the internal resistance generated in the n-emitter ladder shaped pattern is divided into components (Rby1+Rb2+Rbx1) as shown in FIG. 5.

In a typical trench gate type IGBT, a single trench is about in the range from several hundred μm to several mm in length, as shown in FIG. 1, n$^+$emitter region 5 is formed along the lengthwise direction of the trench, and two parallel such n emitter regions are formed in a pattern like cross pieces of the ladder at substantially equal intervals, and the electrical connection is provided from the spanning portion, i.e., the cross piece portion to emitter electrode 11. The portion between cross pieces on n$^+$emitter region 5 serves to electrically connect a p-base region 4 to emitter electrode 11, and a high concentration, p$^+$contact region 6 of the same conductivity type as p-base region 4 is formed. The interval or the width of cross pieces in the n-emitter ladder pattern which widely varies depending upon the on-voltage required for the element, turn off loss and turn off capability is typically 10m or less. The trench interval is about several μm. Therefore, in miniaturized surface patterns, it has been difficult to obtain a desired n-emitter ballast resistance simply by adjusting the pattern size and concentration of n+type emitter region 5 as in the first embodiment, but the second embodiment is advantageous for use in much miniaturized element structures.

According to the second embodiment, the following points are considered: in order to restrain unbalance in the element operation in the lengthwise direction of the trench, the resistance (Rby1) across the C-D region is desirably as small as possible, E-F distance of not more than 1 μm is too small to actually adjust resistance (Rbx1), and an actual n-emitter ballast resistance value is determined based on resistance (Rb2) across the D-F region. In this viewpoint, the high concentration, n-type impurity region of the n-emitter region immediately below p+diffusion region 14 is inactivated and n-emitter ballast resistance (Rb2) is generated in the remaining low impurity region by forming p$^+$diffusion region 14 as shown in FIG. 5. In FIG. 6, n-emitter ballast resistance (Rb2) is shown obliquely in FIG. 6 for ease of illustration, but n-emitter ballast resistance (Rb2) is actually a resistance region generated in the direction perpendicular to the surface of the sheet of FIG. 6, since it is generated immediately below the D-F region as shown in FIG. 5.

Third Embodiment

In the second embodiment described above, p-type diffusion region 14 is provided in a part of the n-emitter region, while in the third embodiment, an electrically neutral region or an insulator such as a silicon oxide film and a silicon nitride film or a semi-insulator having an intermediate characteristic is provided in place of p-type diffusion region 14. The third embodiment has the same function and effect as those of the second embodiment.

One method of forming such an electrically neutral region is to selectively implant a part of $n^+$type emitter region 5 with p-type impurity ions such as boron ions of the opposite conductivity type. More specifically, by implanting p-type impurity ions to compensate the concentration of the n-type impurity (phosphorus, arsenic, antimony or the like) forming the n-emitter region, a neutral region having a very high specific resistance can be formed.

A second method of forming an electrically neutral region is to implant neutral elements. Electrically neutral elements such as silicon, argon and germanium are implanted to a part of $n^+$type emitter region 5, in order to form a part of the n-emitter into amorphous or polycrystalline, or by forming many crystal defects, the specific resistance of a part of $n^+$type emitter region 5 may be increased without changing its n-type characteristic, in other words, without changing the inherent conductivity type of the n-emitter, i.e., n type.

Also, electrically neutral element ions such as oxygen and nitrogen ions may be implanted into a part of $n^+$type emitter region 5 and combined with the silicon elements of the substrate so that a part of $n^+$type emitter region 5 is changed into an insulating film to increase the specific resistance.

A method of selectively oxidizing a part of $n^+$type emitter region 5 will be now described. This method employs LOCOS (Local Oxidation of Silicon) known as a standard LSI wafer process. A part of $n^+$type emitter region 5 is covered with a nitride film or the like which is not easily thermally oxidized, and a desired region of $n^+$type emitter region 5 is oxidized so that a part of the n-type emitter region is changed into an insulator, a silicon oxide film, and effective n-emitter ballast resistance may be generated in the remaining low impurity, n-type emitter region.

An approach employing etching will be now described. According to this method, a part of n-type emitter region 5 of a high impurity concentration and a low specific resistance is etched away and the resistance of the remaining part of the n-emitter region is raised. As the etching method, dry etching is optimum in view of the size precision of miniaturized patterns, while wet etching may be employed in view of the manufacturing cost if there is dimensional allowance.

Modifications

Modifications of the second and third embodiments described above are shown in FIGS. 8 to 16. Among these modifications shown, the patterns of $n^+$type emitter diffusion region 5 and $p^+$diffusion region 14 or a neutralized or inactivated region are changed in view of the overall pattern size, the level of n-type emitter ballast resistance (Rb2) and the like.

Figure 8:
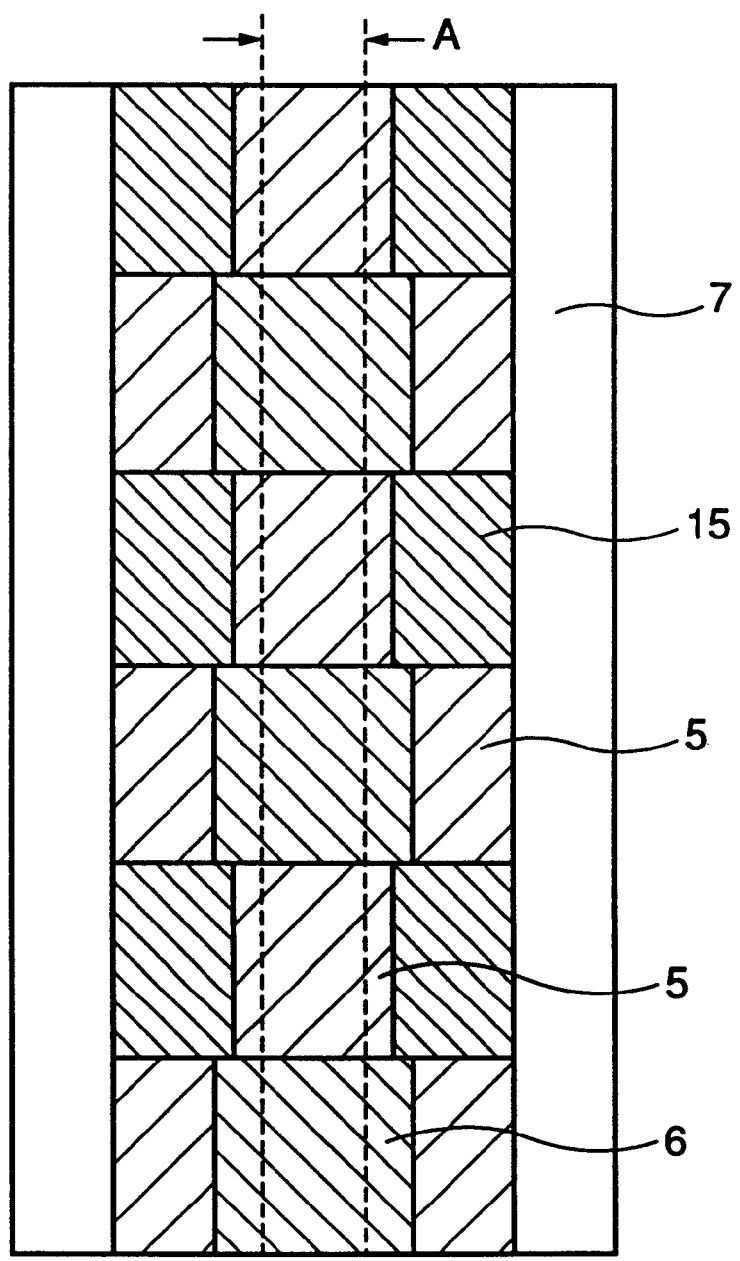
FIG. 8 is a plan view of a modification of the present invention.

In the modification shown in FIG. 8, the width of $p^+$diffusion region 15 is larger than the width of p+diffusion region 14 shown in FIG. 5.

Figure 9:
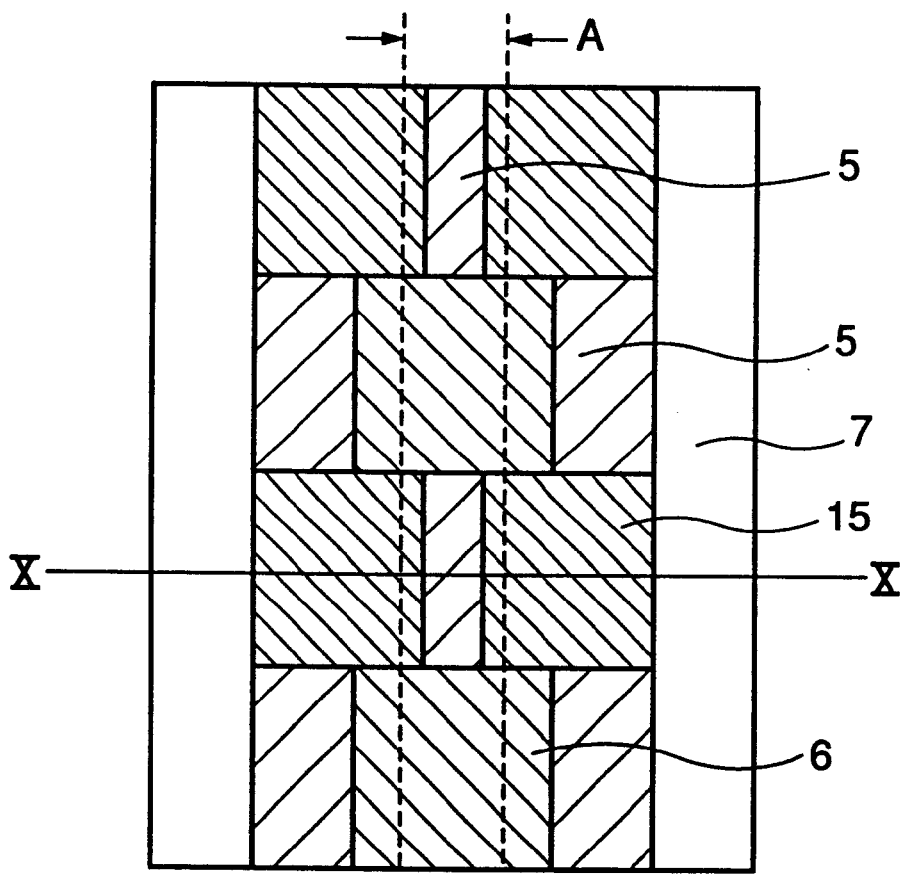
FIG. 9 is a plan view of another modification of the present invention.
Figure 10:
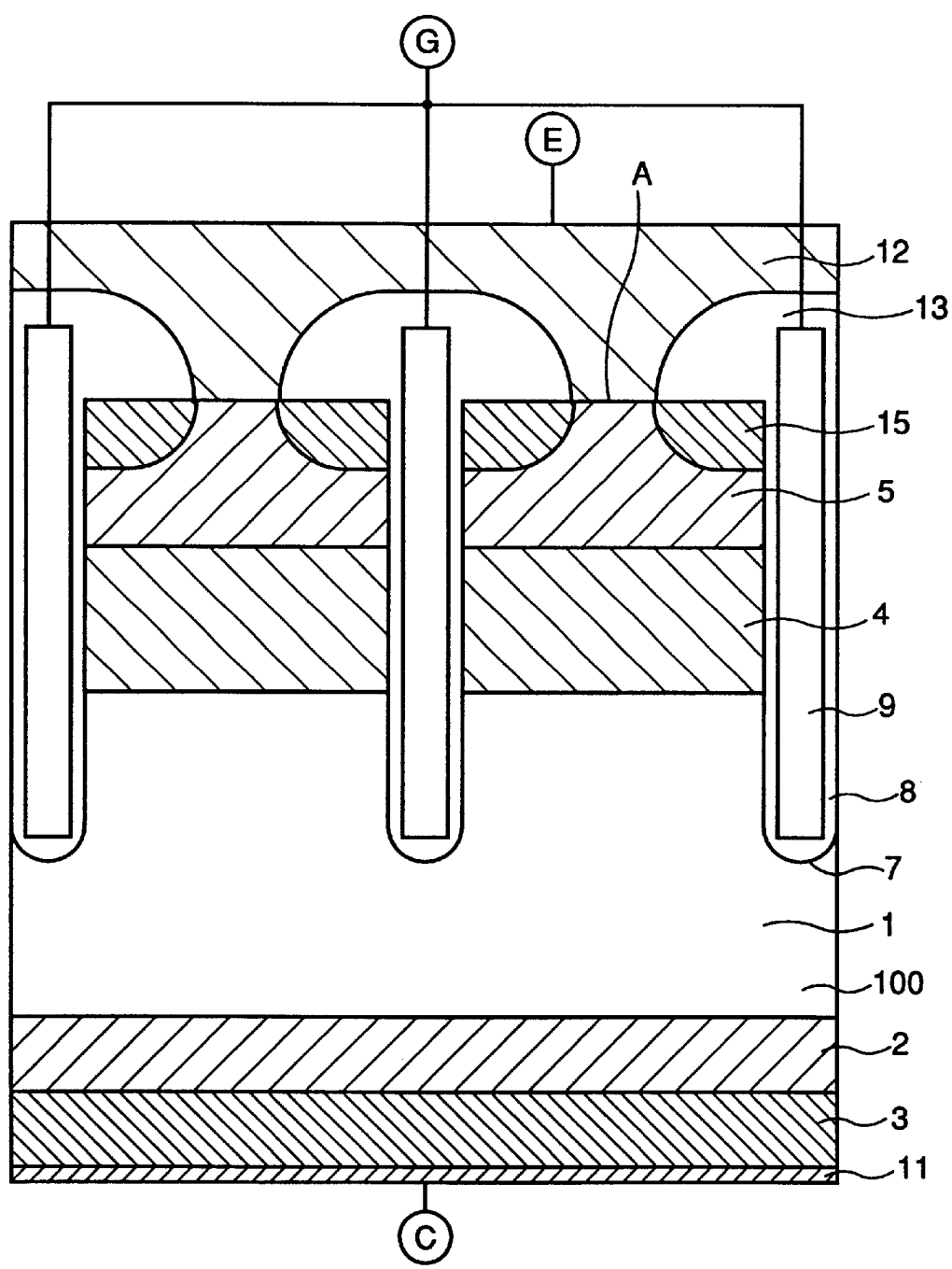
FIG. 10 is a cross sectional view taken along line X—X in FIG. 9.

In the modification shown in FIG. 9, the width of $p^+$diffusion region 15 is further expanded and a cross section taken along line X—X is given in FIG. 10.

Figure 11:
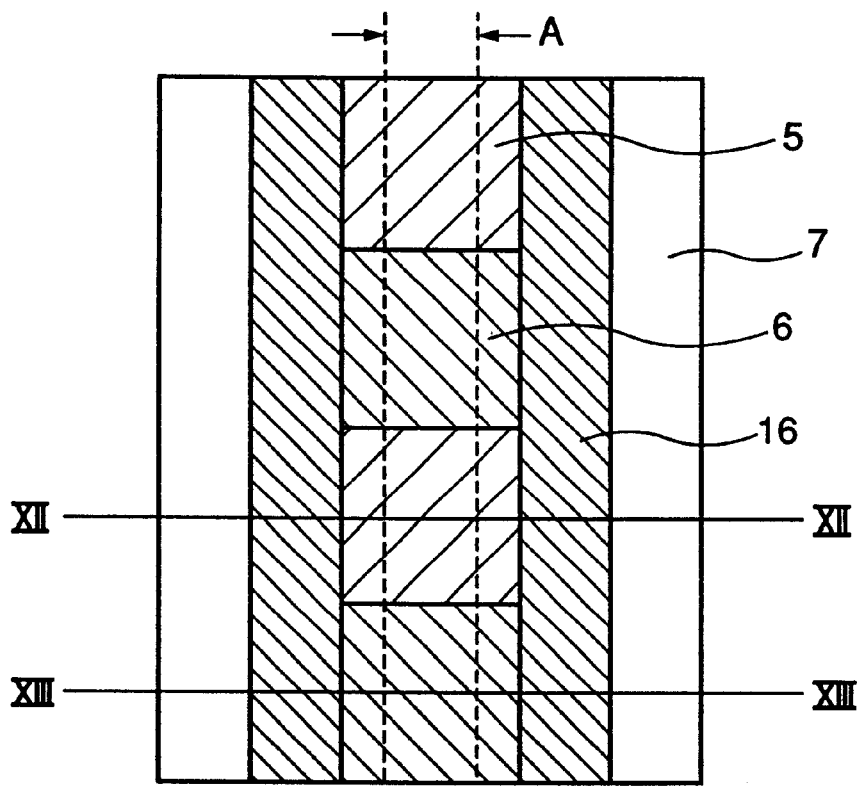
FIG. 11 is a plan view of another modification of the present invention.
Figure 12:
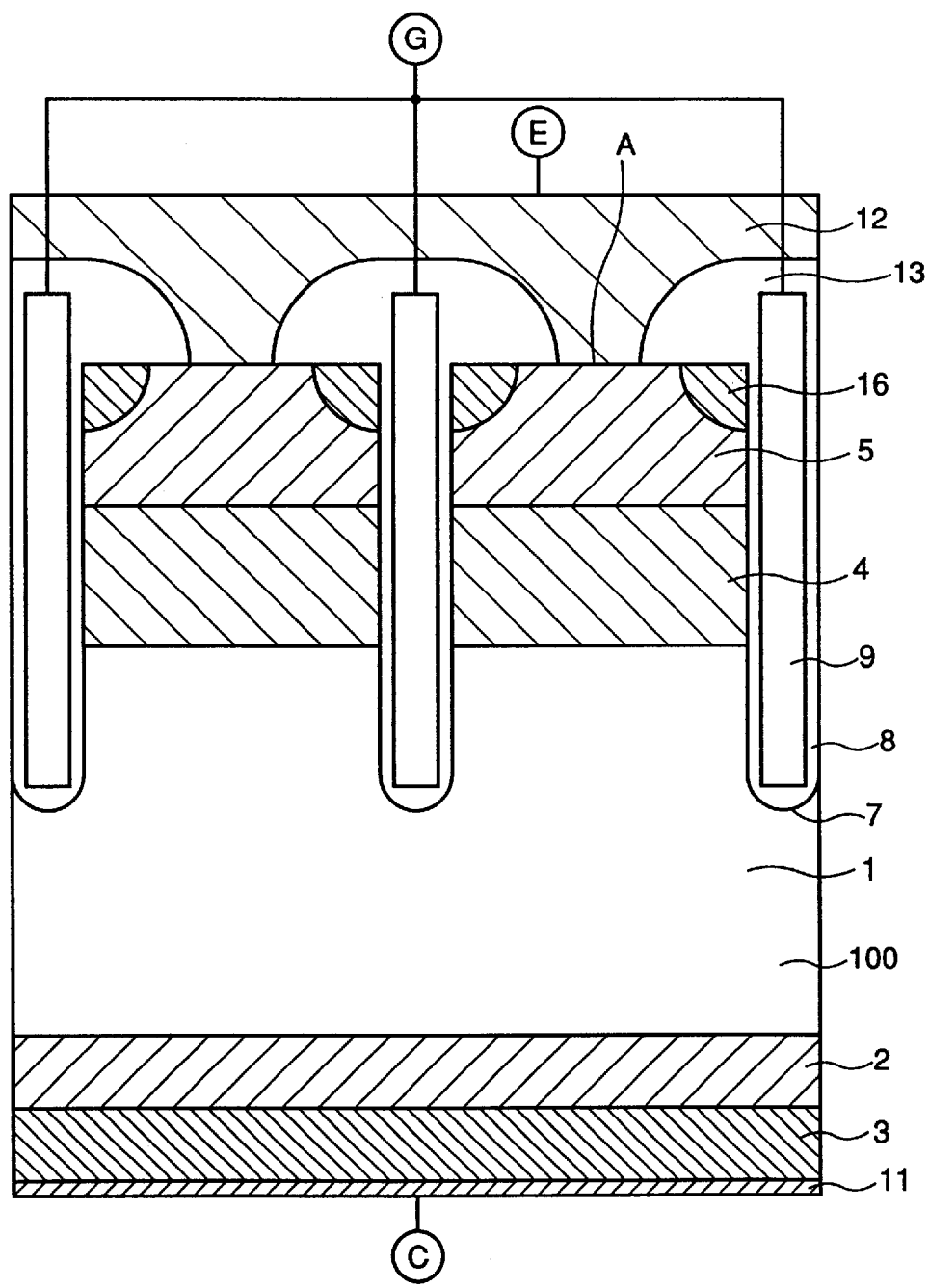
FIG. 12 is a cross sectional view taken along line XII—XII in FIG. 11.
Figure 13:
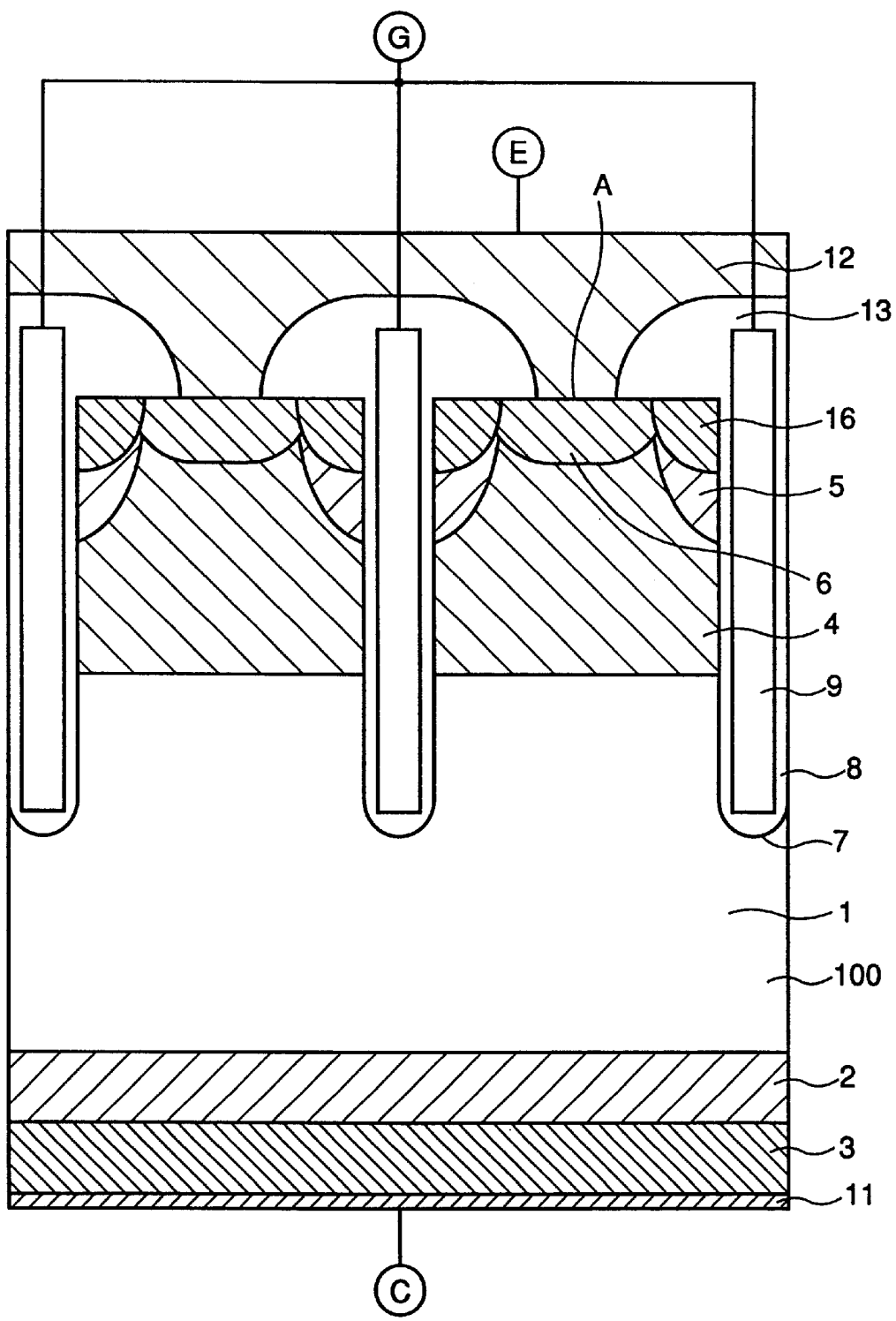
FIG. 13 is a cross sectional view taken along line XIII—XIII in FIG. 11.

In the modification shown in FIG. 11, a $p^+$diffusion region 16 extends along the trench, a cross section taken along line XII—XII in FIG. 11 is given in FIG. 12, and a cross section taken along line XIII—XIII in FIG. 11 is given in FIG. 13.

In the examples shown in FIGS. 11 to 18, the concentration of the portion opposite to the trench gate of $n^+$emitter region 2 may be set sufficiently low, so that a p-inverted channel may be formed with negative bias applied to the gate when the element is turned off. In this case, Icsat previously mentioned is hardly lowered, but the maxim controllable current is increased, so that the SCSOA is improved in the sense that larger Icsat can be cut off as compared to the case without such p-inverted channel formed with negative bias. At the same time, the turn-off time or turn-off loss is reduced and therefore general characteristics may be improved.

Figure 14:
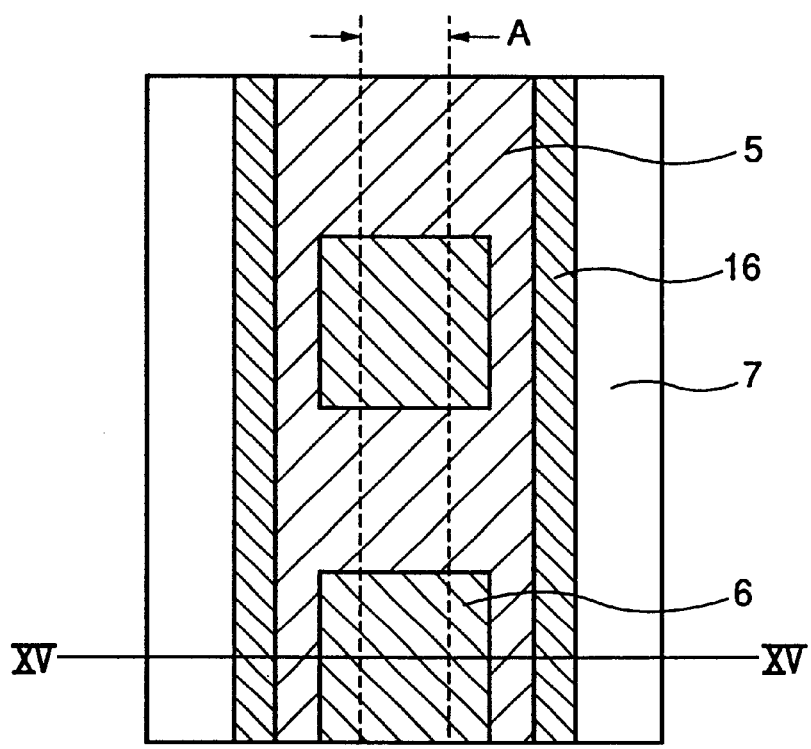
FIG. 14 is a plan view of another modification of the present invention.
Figure 15:
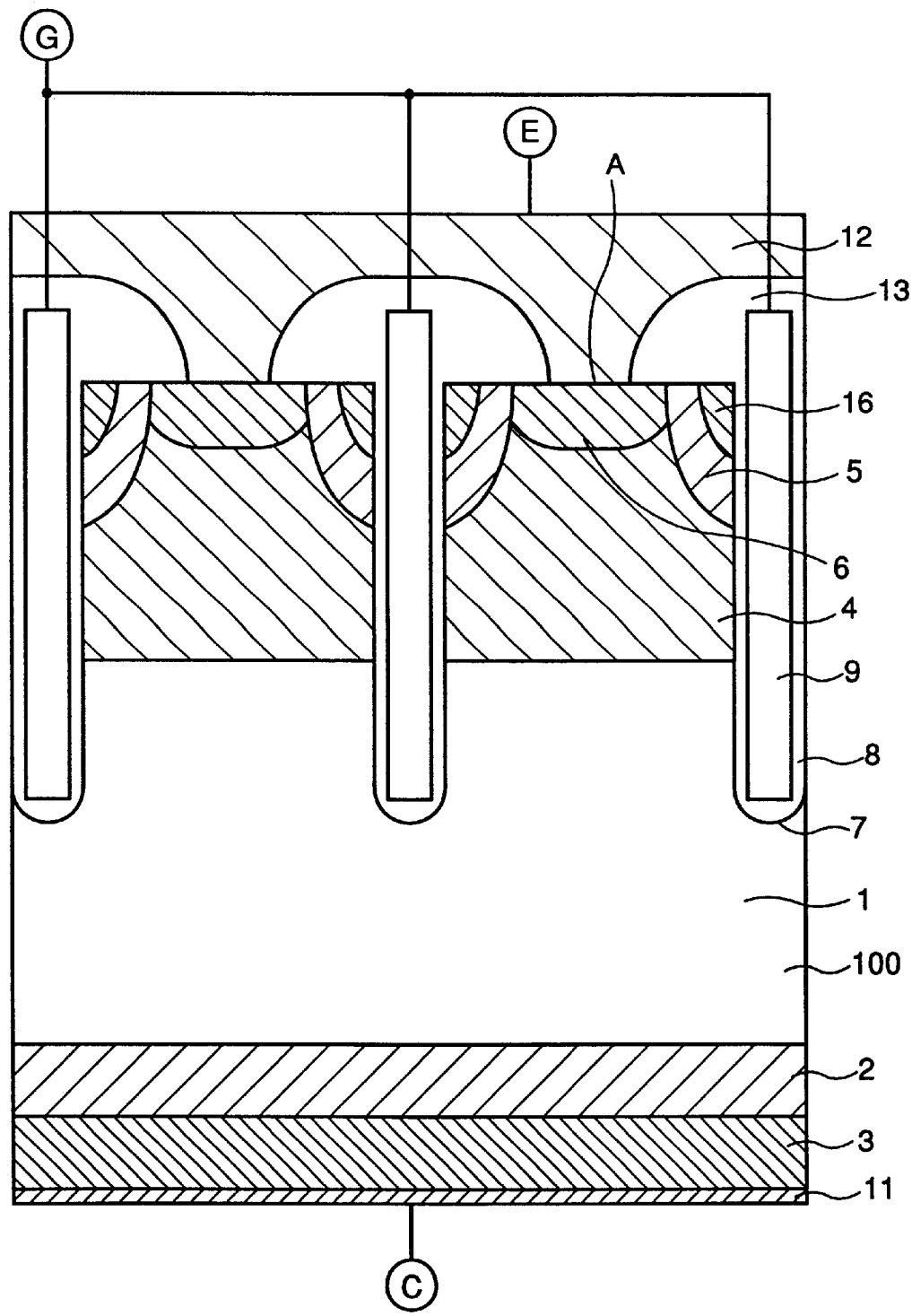
FIG. 15 is a cross sectional view taken along line XV—XV in FIG. 14.

In the modification shown in FIG. 14, $p^+$diffusion region 16 extends along the trench, and $n^+$emitter region 5 is formed into a ladder shape to leave the part corresponding trench 7. A cross section taken along line XV—XV in FIG. 14 is given in FIG. 15.

Figure 16:
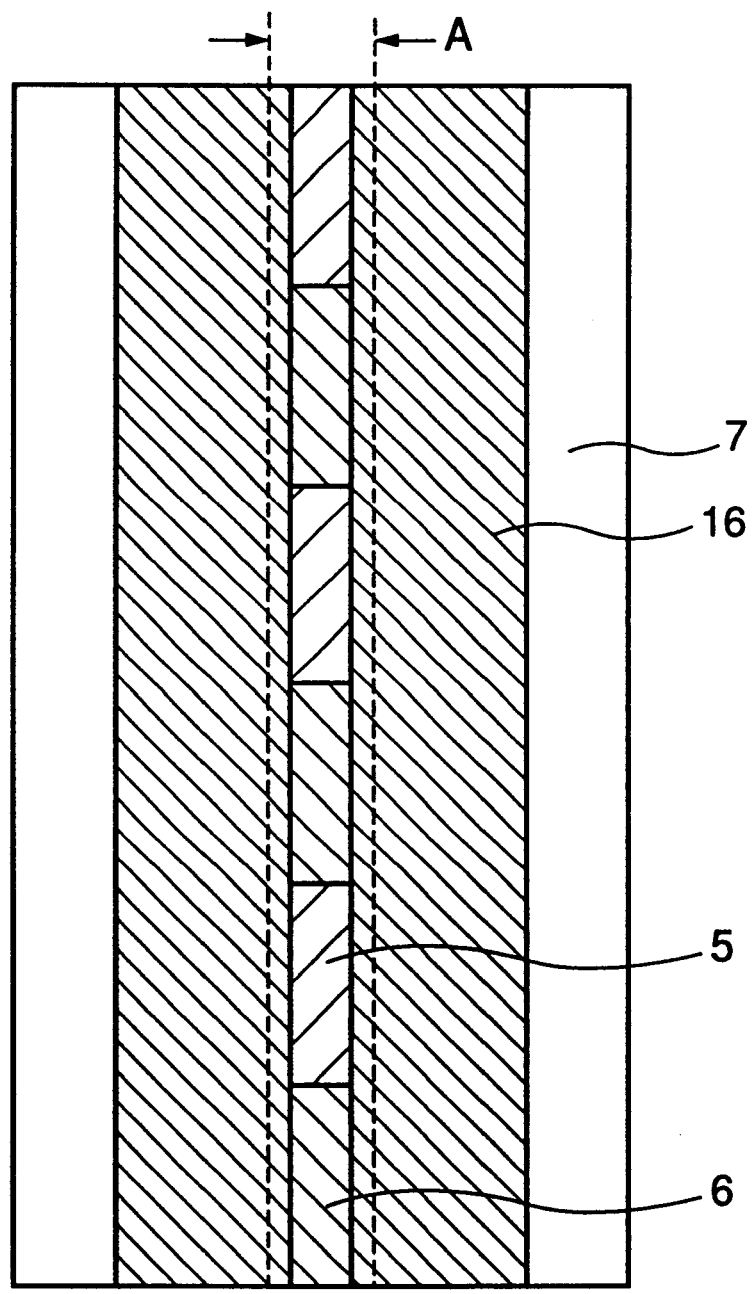
FIG. 16 is a plan view of another modification of the present invention.

In the modification shown in FIG. 16, $p^+$diffusion region 16 extends along trench 7 and the width is larger than that shown in FIG. 11.

Fourth Embodiment

Figure 17:
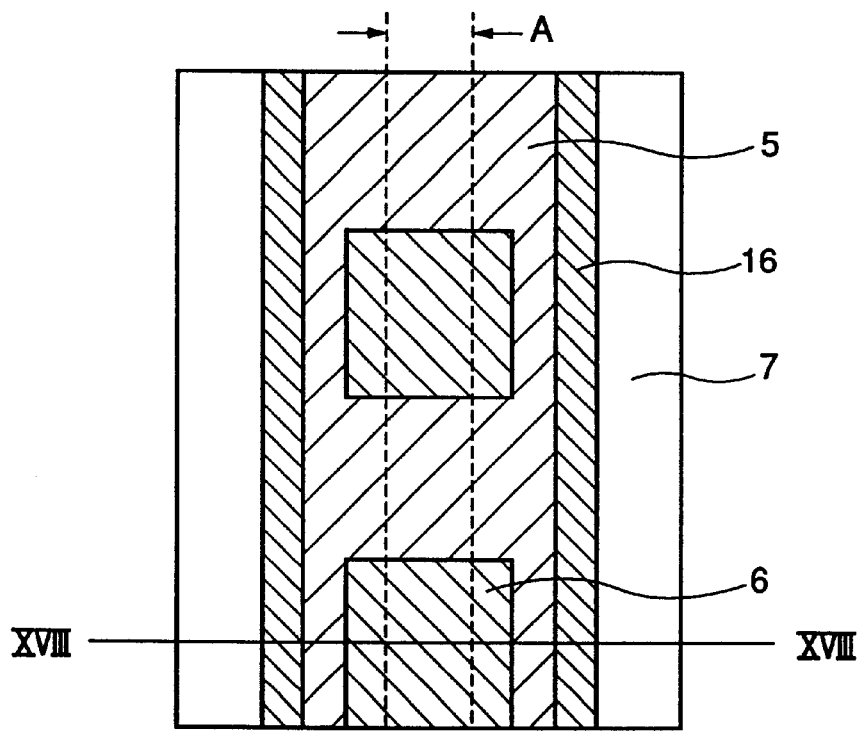
FIG. 17 is a plan view of a fourth embodiment of the present invention.
Figure 18:
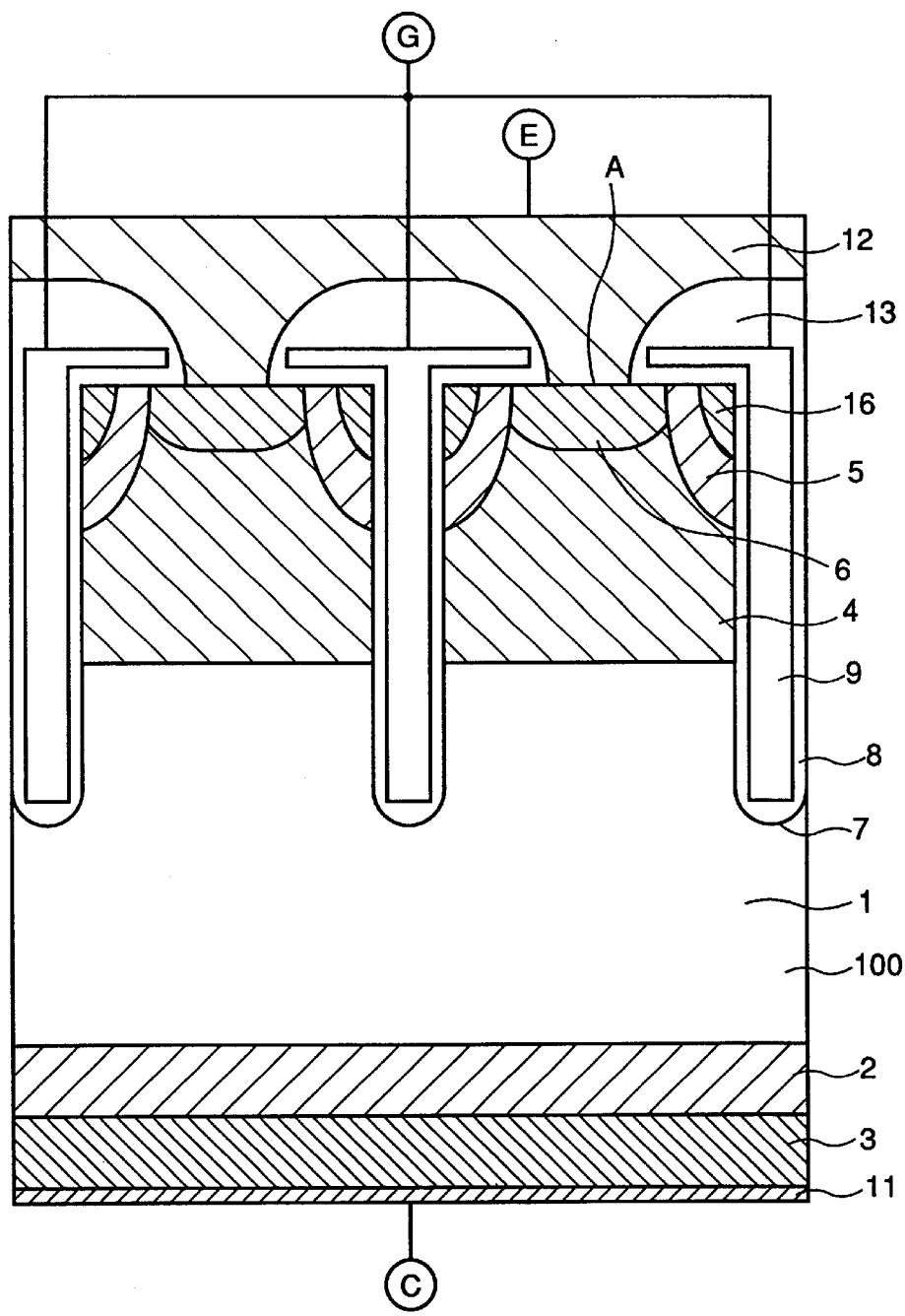
FIG. 18 is a cross sectional view taken along line XVIII—XVIII in FIG. 17.

The present invention is applied to a T-type trench gate, IGBT in an example shown in FIGS. 17 and 18.

FIG. 17 is a plan view and FIG. 18 is a cross sectional view taken along line XVIII—XVIII in FIG. 17.

In this fourth embodiment, the concentration of the portion opposite to the trench gate of $n^+$type emitter region 5 is set sufficiently low and a p-inverted channel can be formed by gate negative bias applied in the off operation of the elements. Since a gate is extended to a exposed part of $n^+$ type emitter region 5 at the surface, the connection of p-base region 5 to the n-emitter electrode with a p-inverted channel in an off state can be further secured. In this embodiment, similarly to the examples in FIGS. 11 to 13, the SCSOA and turn-off loss may be advantageously improved.

Fifth Embodiment

In the above-described embodiments, the present invention is applied to vertical IGBTs, but the present invention is also applicable to lateral IGBTs.

Figure 19:
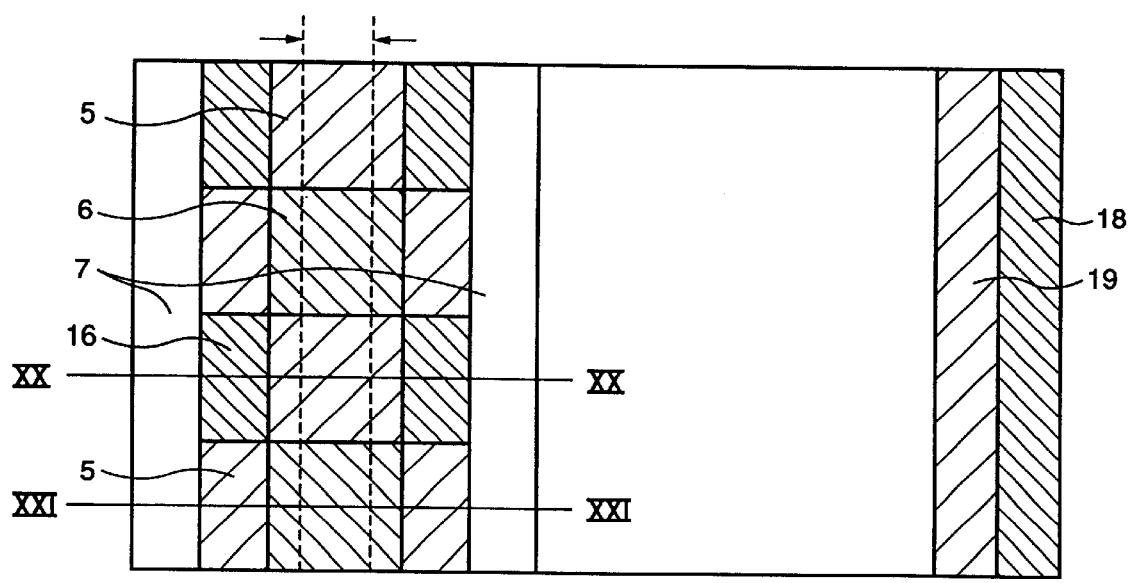
FIG. 19 is a plan view of a fifth embodiment of the present invention.
Figure 20:
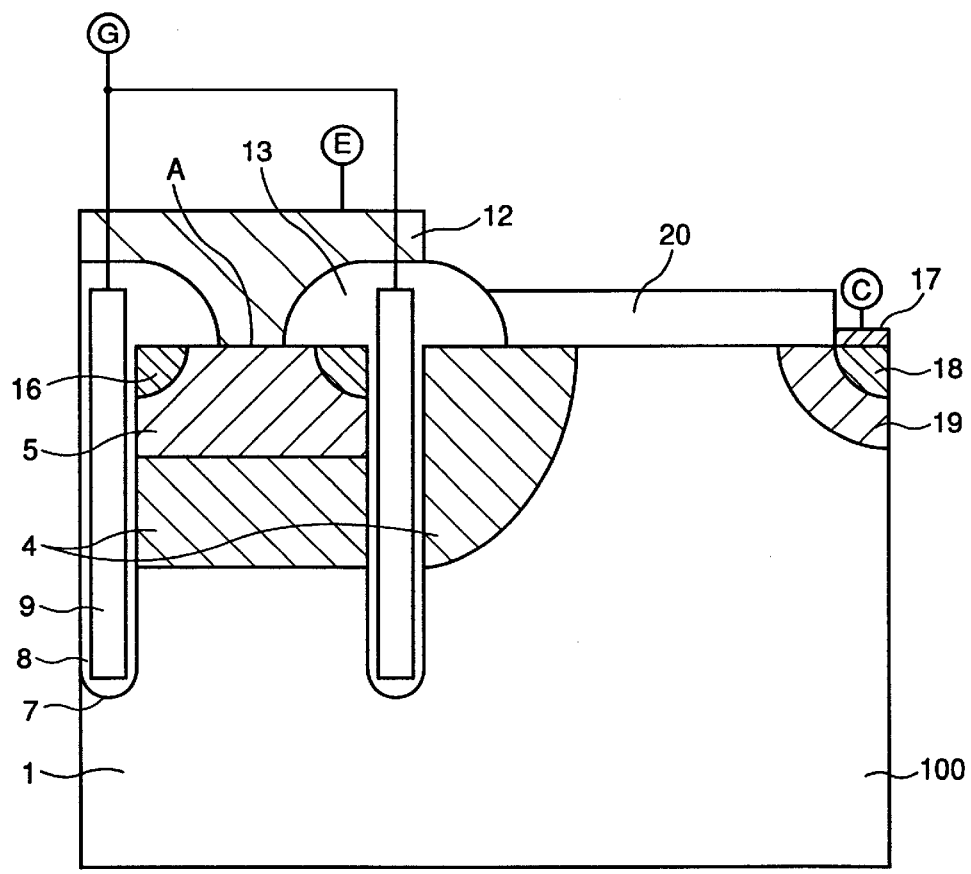
FIG. 20 is a cross sectional view taken along line XX—XX in FIG. 19.
Figure 21:
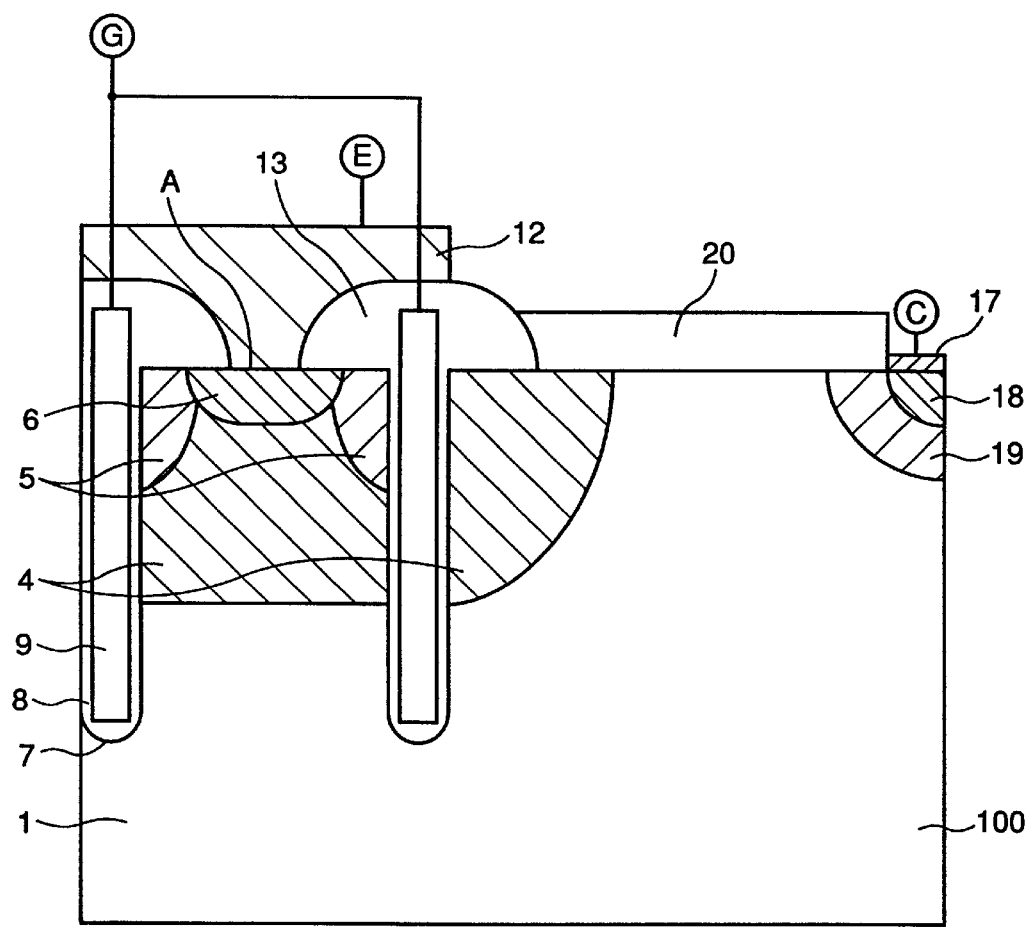
FIG. 21 is a cross sectional view taken along line XXI—XXI in FIG. 19.

FIGS. 19 to 21 show an embodiment of a lateral IGBT, FIG. 19 is a plan view, FIG. 20 is a cross sectional view taken along line XX—XX in FIG. 19, and FIG. 21 is a cross sectional view taken along line XXI—XXI in FIG. 19. In FIGS. 19 to 21, reference numeral 17 represents a collector electrode, 18 a $p^+$collector region, 19 an $n^+$buffer region, and 20 a field oxide film. Collector electrode 17, $p^+$collector region 18, and n+buffer region 19 are formed on the same main surface side of a substrate 100 on which an $n^+$emitter region 5 is formed.

Sixth Embodiment

Figure 22:
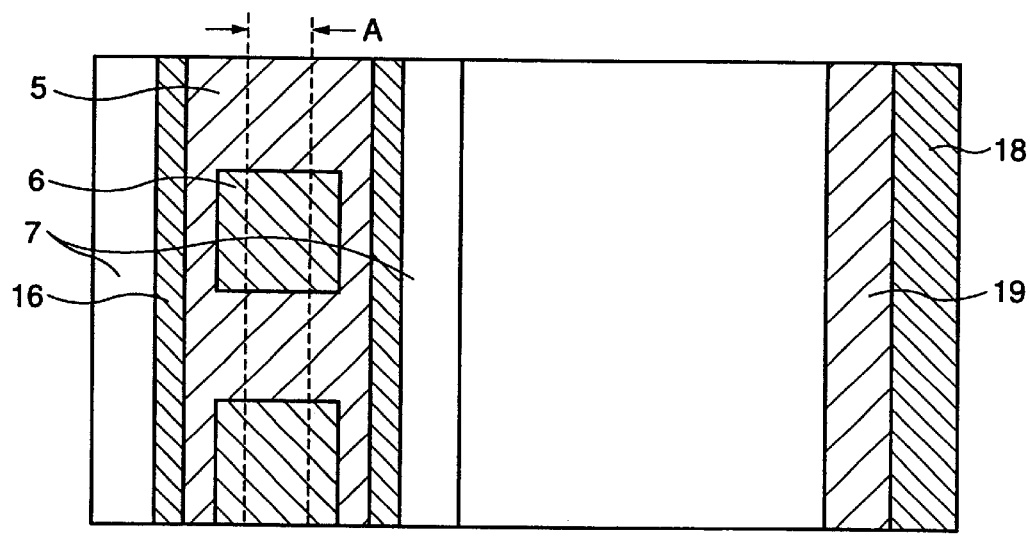
FIG. 22 is a plan view of a sixth embodiment of the present invention.

FIG. 22 is a plan view of another embodiment of a lateral IGBT. Also in this embodiment, a collector electrode (not shown), a p+collector region 18 and an $n^+$buffer region 19 are formed on the same main surface side of a substrate 100 on which an n+emitter region 5 is formed. A $p^+$diffusion region 16 is formed along a trench 7 similarly to that shown in FIG. 14.

In the above described embodiments, the IGBTs are formed using a silicon substrate, but the present invention is by no means limited to the use of silicon, and may be also similarly practiced using compound semiconductor such as SiC and GaAs. Furthermore, the invention is similarly practicable if p and n in the above respective regions are reversed.

INDUSTRIAL APPLICABILITY

As in the foregoing, the present invention can be applied to power semiconductor devices.

What is claimed is:

1. A vertical, insulated-gate bipolar semiconductor device, comprising:
   a semiconductor substrate having first and second main surfaces opposite each other;
   an impurity region of a first conductivity type formed at the first main surface of the semiconductor substrate;
   a first impurity region of a second conductivity type formed at the second main surface of the semiconductor substrate;
   a second impurity region of the second conductivity type internally surrounding the impurity region of the first conductivity type and having a portion exposed in the first main surface;
   a control conductor provided for the second impurity region of the second conductivity type with an insulating film therebetween;
   a first main electrode provided in contact with both the impurity region of the first conductivity type and the second impurity region of the second conductivity type;
   a second main electrode provided at the first impurity region of the second conductivity type; and
   a control electrode connected to the control conductor;
   wherein the impurity region of the first conductivity type is adapted to internally have a total ballast resistance corresponding to an internal resistance thereof and having a value of 0.005 to 0.01 Ω, as received by a current carrier of the first conductivity type moving through the impurity region of the first conductivity type.

2. A lateral, insulated-gate bipolar semiconductor device, comprising:
   a semiconductor substrate having first and second main surfaces opposite to each other;
   an impurity region of a first conductivity type formed at the first main surface of the semiconductor substrate;
   a first impurity region of a second conductivity type formed on the first main surface of the semiconductor substrate;
   a second impurity region of the second conductivity type internally surrounding the impurity region of the first conductivity type and having a portion exposed in the first main surface;
   a control conductor provided for the second impurity region of the second conductivity type with an insulating film therebetween;
   a first main electrode provided in contact with both the impurity region of the first conductivity type and the second impurity region of the second conductivity type;
   a second main electrode provided at the first impurity region of the second conductivity type; and
   a control electrode connected to the control conductor,
   wherein the impurity region of the first conductivity type is adapted to internally have a total ballast resistance corresponding to an internal resistance thereof and having a value of 0.005 to 0.01 Ω, as received by a current carrier of the first conductivity type.

3. The vertical, insulated-gate bipolar semiconductor device according to claim 1, wherein a concentration of an impurity of the first conductivity in a portion of the impurity region of the first conductivity type extending in a direction traversing the insulating film and extending along a portion exposed in the first main surface of the second impurity region of the second conductivity type, as seen in two dimensions, is lower than the concentration of an impurity of the first conductivity of a portion extending between the portion exposed in the first main surface of the second impurity region of the second conductivity and the control conductor.

4. The lateral, insulated-gate bipolar semiconductor device according to claim 2, wherein the concentration of an impurity of the first conductivity in a portion of the impurity region of the first conductivity type extending in a direction traversing the insulating film and extending along a portion exposed in the first main surface of the second impurity region of the second conductivity type, as seen in two dimensions, is lower than the concentration of an impurity of the first conductivity of a portion extending between the portion exposed in the first main surface of the second impurity region of the second conductivity and the control conductor.

5. The vertical, insulated-gate bipolar semiconductor device according to claim 1, wherein a length of a portion of the impurity region of the first conductivity type extending in a direction traversing the insulating film and extending along a portion exposed in the first main surface of the second impurity region of the second conductivity type, as seen in two dimensions, is at least twice the length of a portion extending between the portion exposed in the first main surface of the second impurity region of the second conductivity and the control conductor.

6. The lateral, insulated-gate bipolar semiconductor device according to claim 2, wherein a length of a portion of the impurity region of the first conductivity type extending in a direction traversing the insulating film and extending along a portion exposed in the first main surface of the second impurity region of the second conductivity type, as seen in two dimensions, is at least twice the length of a portion extending between the portion exposed in the first main surface of the second impurity region of the second conductivity and the control conductor.

7. The vertical, insulated-gate bipolar semiconductor device according to claim 1, wherein the control conductor is formed in a trench provided in the first main surface of the semiconductor substrate.

8. The lateral, insulated-gate bipolar semiconductor device according to claim 2, wherein the control conductor is formed in a trench provided in the first main surface of the semiconductor substrate.

9. A vertical, insulated-gate bipolar semiconductor device, comprising:
   a semiconductor substrate having first and second main surfaces opposite to each other;
   an impurity region of a first conductivity type formed at the first main surface of the semiconductor substrate;
   a first impurity region of a second conductivity type formed on the second main surface of the semiconductor substrate;

a second impurity region of the second conductivity type internally surrounding the impurity region of the first conductivity type and having a portion exposed in the first main surface;

a control conductor provided for the second impurity region of the second conductivity type with an insulating film therebetween;

a first main electrode provided in contact with both the impurity region of the first conductivity type and the second impurity region of the second conductivity type;

a second main electrode provided at the first impurity region of the second conductivity type; and a control electrode connected to the control conductor, wherein a region to increase a resistance of the impurity region of the first conductivity type is formed in a vicinity of a surface of the impurity region of the first conductivity type.

10. A lateral, insulated-gate bipolar semiconductor device, comprising:

a semiconductor substrate having first and second main surfaces opposite to each other;

an impurity region of a first conductivity type formed at the first main surface of the semiconductor substrate;

a first impurity region of a second conductivity type formed on the second main surface of the semiconductor substrate;

a second impurity region of the second conductivity type internally surrounding the impurity region of the first conductivity type and having a portion exposed in the first main surface;

a control conductor provided for the second impurity region of the second conductivity type with an insulating film therebetween;

a first main electrode provided in contact with both the impurity region of the first conductivity type and the second impurity region of the second conductivity type;

a second main electrode provided at the first impurity region of the second conductivity type; and a control electrode connected to the control conductor, wherein a region to increase a resistance of the impurity region of the first conductivity type is formed in a vicinity of a surface of the impurity region of the first conductivity type.

11. The vertical, insulated-gate bipolar semiconductor device according to claim 9, wherein means for forming the region to increase the resistance in the vicinity of the surface of the impurity region of the first conductivity type comprises a third impurity region of the second conductivity type in the vicinity of the surface of the impurity region of the first conductivity type.

12. The lateral, insulated-gate bipolar semiconductor device according to claim 10, wherein means for forming the region to increase the resistance in the vicinity of the surface of the impurity region of the first conductivity type comprises a third impurity region of the second conductivity type in the vicinity of the surface of the impurity region of the first conductivity type.

13. The vertical, insulated-gate bipolar semiconductor device according to claim 9, wherein means for forming the region to increase the resistance in the vicinity of the surface of the impurity region of the first conductivity type comprises a neutral region in the vicinity of the surface of the impurity region of the first conductivity type.

14. The lateral, insulated-gate bipolar semiconductor device according to claim 10, wherein means for forming the region to increase the resistance in the vicinity of the surface of the impurity region of the first conductivity type comprises a neutral region in the vicinity of the surface of the impurity region of the first conductivity type.

15. The vertical, insulated-gate bipolar semiconductor device according to claim 13, wherein the neutral region is formed by introducing an impurity of the second conductivity type into the impurity region of the first conductivity type for compensation.

16. The vertical, insulated-gate bipolar semiconductor device according to claim 13, wherein the neutral region is formed by introducing an electrically inactive element into the impurity region of the first conductivity type.

17. The lateral, insulated-gate bipolar semiconductor device according to claim 14, wherein the neutral region is formed by introducing an impurity of the second conductivity type into the impurity region of the first conductivity type for compensation.

18. The lateral, insulated-gate bipolar semiconductor device according to claim 14, wherein the neutral region is formed by introducing an electrically inactive element into the impurity region of the first conductivity type for compensation.

19. The vertical, insulated-gate bipolar semiconductor device according to claim 9, wherein the means for forming the region to increase the resistance in the vicinity of the surface of the impurity region of the first conductivity type comprises introducing in the vicinity of the surface of the impurity region of the first conductivity type an element chemically reacting with the semiconductor substrate to form an insulator.

20. The lateral, insulated-gate bipolar semiconductor device according to claim 10, wherein the means for forming the region to increase the resistance in the vicinity of the surface of the impurity region of the first conductivity type comprises introducing in the vicinity of the surface of the impurity region of the first conductivity type an element chemically reacting with the semiconductor substrate to form an insulator.

21. The vertical, insulated-gate bipolar semiconductor device according to claim 9, wherein the means for forming the region to increase the resistance in the vicinity of the surface of the impurity region of the first conductivity type comprises etching away a portion of the impurity region of the first conductivity type.

22. The lateral, insulated-gate bipolar semiconductor device according to claim 10, wherein the means for forming the region to increase the resistance in the vicinity of the surface of the impurity region of the first conductivity type comprises etching away a portion of the impurity region of the first conductivity type.

23. The vertical, insulated-gate bipolar semiconductor device according to claim 9, wherein an opposite potential applied to the control electrode when current is cut off inverts to the second conductivity type a portion of the impurity region of the first conductivity type opposite to the control conductor, the inverted region provides a third impurity region of the second conductivity type electrically connectable with the second impurity region of the second conductivity type, and an impurity concentration of a portion of the impurity region of the first conductivity type is lowered.

24. The lateral, insulated-gate bipolar semiconductor device according to claim 10, wherein a opposite potential applied to the control electrode when current is cut off inverts to the second conductivity type a portion of the impurity region of the first conductivity type opposite to the control conductor, the inverted region provides a third impurity region of the second conductivity type electrically connectable with the second impurity region of the second conductivity type, and an impurity concentration of a portion of the impurity region of the first conductivity type is lowered.

25. The vertical, insulated-gate bipolar semiconductor device according to claim 23, wherein the third impurity region of the second conductivity type is formed isolated from the second impurity region of the second conductivity type electrically connected directly to the first main electrode, the opposite potential applied to the control electrode when current is cut off inverts the impurity region of the first conductivity type to the second conductivity type, and the inverted region electrically connects the second impurity region of the second conductivity type and the third impurity region of the second conductivity type.

26. The lateral, insulated-gate bipolar semiconductor device according to claim 24, wherein the third impurity region of the second conductivity type is formed isolated from the second impurity region of the second conductivity type electrically connected directly to the first main electrode, the opposite potential applied to the control electrode when current is cut off inverts the impurity region of the first conductivity type to the second conductivity type, and the inverted region electrically connects the second impurity region of the second conductivity type and the third impurity region of the second conductivity type.

* * * * *